US012690170B2

(12) United States Patent (10) Patent No.: US 12,690,170 B2
Goli et al. (45) Date of Patent: Jul. 21, 2026

(54) ABRASION-RESISTANT COATINGS FOR THERMAL INTERFACES

(71) Applicant: Henkel AG & Co. KGaA, Duesseldorf (DE)

(72) Inventors: Pradyumna Goli, El Dorado Hills, CA (US); Justin Kolbe, Rochester, MN (US); Reid J. Chesterfield, Eden Prairie, MN (US); Paul A. Pedersen, Midland, MI (US)

(73) Assignee: Henkel AG & Co. KGaA, Duesseldorf (DE)

( * ) Notice: Subject to any disclaimer, the term of this patent is extended or adjusted under 35 U.S.C. 154(b) by 899 days.

(21) Appl. No.: 17/205,567

(22) Filed: Mar. 18, 2021

(65) Prior Publication Data

US 2021/0212241 A1 Jul. 8, 2021

Related U.S. Application Data

(63) Continuation of application No. PCT/US2019/053342, filed on Sep. 27, 2019.
(Continued)

(51) Int. Cl.
*H01R 24/60* (2011.01)
*B05D 7/14* (2006.01)
(Continued)

(52) U.S. Cl.
CPC ........... *H05K 7/20481* (2013.01); *B05D 7/14* (2013.01); *C08K 3/28* (2013.01); *C08L 83/04* (2013.01);
(Continued)

(58) Field of Classification Search
CPC . G02B 6/4269; G02B 6/4261; H01L 23/3737; H01L 23/3672; B32B 7/12;
(Continued)

(56) References Cited

U.S. PATENT DOCUMENTS 3,434,943 A 3/1969 Working
3,908,040 A 9/1975 Dauksys
(Continued)

FOREIGN PATENT DOCUMENTS

CN 101405859 A 4/2009
CN 204761937 U 11/2015
(Continued)

OTHER PUBLICATIONS

Naritomi et al., WO-2009093668-A1 (translation) (Year: 2009).*
(Continued)

*Primary Examiner* — Leonard Chang
*Assistant Examiner* — Tsz K Chiu
(74) *Attorney, Agent, or Firm* — Mary K. Cameron

(57) ABSTRACT

A system having a removable electronic component employs an abrasion-resistant thermally conductive film as a thermal interface between the removable electronic component and a heat sink. The abrasion-resistant film reduces thermal impedance between the removable electronic component and the heat sink when the removable electronic component is repeatedly installed and removed from a chamber in a host device. The abrasion-resistant film includes a polymer formed from a silicone-containing resin and an inorganic particulate filler; the film may also be interlocked with a corrosion protection layer at the heat sink. A method of forming a heat sink is provided that minimizes increases in thermal impedance.

11 Claims, 6 Drawing Sheets

Related U.S. Application Data

(60) Provisional application No. 62/737,437, filed on Sep. 27, 2018.

(51) Int. Cl.

| | |
|---|---|
| *C08K 3/28* | (2006.01) |
| *C08L 83/04* | (2006.01) |
| *C23C 22/83* | (2006.01) |
| *G02B 6/42* | (2006.01) |
| *H05K 1/02* | (2006.01) |
| *H05K 7/20* | (2006.01) |

(52) U.S. Cl.
CPC ........... *C23C 22/83* (2013.01); *H05K 1/0204* (2013.01); *B05D 2202/25* (2013.01); *B05D 2202/45* (2013.01); *B05D 2350/65* (2013.01); *B05D 2518/10* (2013.01); *B05D 2601/20* (2013.01); *C08K 2003/282* (2013.01); *C08K 2201/005* (2013.01)

(58) Field of Classification Search
CPC ........... B32B 2255/10; F28F 2013/006; H05K 1/0209; H05K 1/0204; H05K 7/2039; H05K 2201/0162; H05K 7/20418; H05K 7/205; H05K 1/0206; H05K 1/0201; H05K 3/28; H05K 3/284; H05K 3/285; H05K 3/30; H05K 7/20; H05K 7/20336; H05K 7/20454; H05K 1/0203; H05K 1/0306; H05K 1/111; H05K 2201/066; H05K 2201/10015; H05K 2201/10022; H05K 2203/122; H05K 5/00; H05K 7/1427; H05K 7/1452; H05K 7/1487; H05K 7/20218; H05K 7/20254; H05K 7/20409; H05K 7/20436; H05K 7/20509; H05K 7/20636; H05K 7/20645; H05K 7/20718; H05K 7/20772; H05K 9/0058
See application file for complete search history.

(56) References Cited

U.S. PATENT DOCUMENTS

| | | | | |
|---|---|---|---|---|
| 4,162,947 | A | 7/1979 | Canaris | |
| 5,028,984 | A * | 7/1991 | Ameen | H01L 24/29 |
| | | | | 524/80 |
| 6,361,833 | B1 | 3/2002 | Nakada et al. | |
| 6,451,448 | B1 * | 9/2002 | Kanda | H01L 23/142 |
| | | | | 428/626 |
| 6,472,742 | B1 * | 10/2002 | Bhatia | H01L 23/4093 |
| | | | | 257/713 |
| 6,946,401 | B2 | 9/2005 | Huang et al. | |
| 8,047,708 | B2 * | 11/2011 | Hallen | G01K 17/00 |
| | | | | 374/33 |
| 8,223,498 | B2 * | 7/2012 | Lima | H05K 1/0206 |
| | | | | 361/720 |
| 8,535,787 | B1 * | 9/2013 | Lima | B32B 27/06 |
| | | | | 428/458 |
| 9,056,694 | B2 | 6/2015 | Lima | |
| 9,312,419 | B2 * | 4/2016 | Soon | H01L 31/0543 |
| 9,474,188 | B2 * | 10/2016 | Moore | G02B 6/4269 |
| 9,481,851 | B2 * | 11/2016 | Matsumoto | C08L 83/04 |
| 9,611,414 | B2 * | 4/2017 | Timmerman | H01L 23/3737 |
| 9,693,481 | B2 * | 6/2017 | Timmerman | H01L 23/3737 |
| 9,912,107 | B2 * | 3/2018 | Bucher | G02B 6/4269 |
| 10,178,804 | B2 * | 1/2019 | Sharf | H01R 12/70 |
| 10,205,277 | B2 * | 2/2019 | Kimura | H01R 13/631 |
| 10,398,050 | B2 * | 8/2019 | Tracy | H05K 7/2039 |
| 10,534,146 | B2 * | 1/2020 | Cabessa | G02B 6/4269 |
| 10,555,439 | B2 * | 2/2020 | Johnson | G02B 6/4269 |
| 10,765,032 | B2 * | 9/2020 | Lunsman | H05K 7/20263 |
| 10,781,349 | B2 * | 9/2020 | Zhang | H01L 24/32 |
| 11,520,311 | B2 * | 12/2022 | Lau | H01R 12/721 |
| 2002/0012762 | A1 * | 1/2002 | Bunyan | H01L 23/36 |
| | | | | 257/E23.101 |
| 2003/0092789 | A1 | 5/2003 | Jin et al. | |
| 2003/0203188 | A1 * | 10/2003 | H. | C09K 5/063 |
| | | | | 428/328 |
| 2004/0081843 | A1 | 4/2004 | Bunyan | |
| 2005/0029655 | A1 * | 2/2005 | Wu | H01L 23/3672 |
| | | | | 257/734 |
| 2005/0195565 | A1 * | 9/2005 | Bright | H05K 7/20418 |
| | | | | 361/688 |
| 2006/0286867 | A1 * | 12/2006 | LeGrow | H01R 13/658 |
| | | | | 439/620.24 |
| 2007/0274046 | A1 * | 11/2007 | Choi | H05K 5/0295 |
| | | | | 361/702 |
| 2008/0182441 | A1 * | 7/2008 | Kiryu | H01R 13/631 |
| | | | | 439/159 |
| 2009/0061184 | A1 * | 3/2009 | Jaworowski | C23C 18/127 |
| | | | | 427/580 |
| 2009/0092169 | A1 * | 4/2009 | Hallen | G01K 17/00 |
| | | | | 374/33 |
| 2009/0122491 | A1 | 5/2009 | Martin et al. | |
| 2009/0296351 | A1 | 12/2009 | Oki et al. | |
| 2010/0038254 | A1 | 2/2010 | Takizawa et al. | |
| 2011/0110048 | A1 | 5/2011 | Lima | |
| 2011/0269346 | A1 * | 11/2011 | Casher | H01R 29/00 |
| | | | | 439/626 |
| 2013/0077253 | A1 | 3/2013 | Macall | |
| 2014/0321061 | A1 | 10/2014 | Moore et al. | |
| 2015/0044450 | A1 * | 2/2015 | Yuasa | C09D 7/61 |
| | | | | 428/335 |
| 2015/0184053 | A1 * | 7/2015 | Krishnan | C09K 5/06 |
| | | | | 29/890.03 |
| 2017/0121841 | A1 | 5/2017 | Dolan et al. | |
| 2019/0044299 | A1 * | 2/2019 | Kazav | H01R 27/00 |
| 2019/0132994 | A1 * | 5/2019 | Johnson | H01R 13/6581 |

FOREIGN PATENT DOCUMENTS

| | | | | |
|---|---|---|---|---|
| CN | 107611213 | A | 1/2018 | |
| CN | 108184316 | A | 6/2018 | |
| CN | 207692252 | U | 8/2018 | |
| CN | 207747489 | U | 8/2018 | |
| KR | 10-2014-0048849 | A | 4/2004 | |
| WO | 2004048434 | A2 | 6/2004 | |
| WO | WO-2009093668 | A1 * | 7/2009 | C09J 167/06 |

OTHER PUBLICATIONS

Picard, Loic et al., "Chemical Adhesion of Silicone Elastomers on Primed Metal Surfaces: A Comprehensive Survey of Open and Patent Literatures", Progress in Organic Coatings, vol. 80 (2015), Nov. 27, 2014, pp. 120-141.

White Paper, Thermal Management at the Faceplate, Optical Internetworking Forum, 2010, OIF-PLUG-Thermal-01.0, Retrieved from http://www.oiforum.com/wp-content/uploads/OIF_PLUG_Thermal-01.0_W.pdf.

Mack, B. and Graham, T. "Pluggable Optics Modules—Thermal Specifications, Part 1" Electronics Cooling, Jul. 7, 2016, Retrieved from https://www.electronics-cooling.com/2016/07/pluggable-optics-modules-thermal-specifications-part-1/#.

International Search Report for PCT/US2019/053342, mailed Jul. 13, 2020.

Supplementary Partial European Search Report, application EP 19900355 dated May 20, 2020.

Supplementary European Search Report for EP 19900355 dated Aug. 26, 2022.

Picard, C. et al, "Chemical adhesion of silicone elastomers on primed metal surfaces: A comprehensive survey of open and patent literatures", Process in Organic Coatings, vol. 80, Dec. 22, 2014, pp. 120-141.

* cited by examiner

FIG.7

ABRASION-RESISTANT COATINGS FOR THERMAL INTERFACES

FIELD OF THE INVENTION

The present invention relates to thermally conductive films as a thermal interface between a heat-generating device and a heat sink. The present invention is more particularly directed to an abrasion-resistant thermally conductive film that reduces thermal impedance between the heat-generating device and the heat sink, to allow repeated installation and removal of the heat-generating device.

BACKGROUND OF THE INVENTION

Electronic systems are increasingly relying upon faster speeds and greater capabilities in smaller packages. Moreover, electronic systems continue to employ an increasingly complex array of electronic devices, including modular arrays that are operable with various and replaceable components. Examples of replaceable components include optical transceivers, such as a C-form-factor pluggable (CFP) optical transceiver, and a small form-factor pluggable (SFP) optical transceiver that can be installed in/or removed from a modular system. Such optical transceivers are "pluggable", in that they may be inserted and removed from the host device or system without removing power from the host device or system. The pluggable transceivers are typically received at chambers or ports defined by respective frames of the host system.

In order to prevent heat accumulation in the pluggable electronic components, heat dissipation devices may be used at and/or around the receiving chambers to assist in dissipating generated heat away from the pluggable electronic components. In typical embodiments, the heat dissipation devices contact the pluggable electronic components when installed in the chamber so that heat may be conductively dissipated from the pluggable electronic component. The efficiency of the conductive heat transfer from the pluggable electronic component to the heat dissipation device is limited in large part by the thermal impedance of the interface between the pluggable electronic component and the heat dissipation device. Commonly, non-contact in portions of the interface can impede thermal transfer such that heat transfer by conduction is limited to only the portions of the contact region where the respective surfaces of the pluggable electronic device and the heat dissipation device are in contact. Often, the contacting surfaces are metal uneven. The uneven surface combined with the surface rigidity prevents widespread physical contact between the surfaces.

One way to reduce the thermal impedance at an interface between metal surfaces is to coat at least one of the metal surfaces with a compliant or conformable thermal interface material, such as a paste, gel, film, or the like. Such conformable thermal interface materials, while effective in static applications of the pluggable electronic component and an associated heat dissipation device, cannot withstand the abrasion forces incurred in a dynamic setting, such as pluggable electronic components in which the pluggable electronic component is repeatedly slid into and out from a chamber in abrasive contact with the heat dissipation device. As a result, these conformable thermal interface materials tend to disintegrate over a period of time due to the repeated installation and removal of the pluggable electronic component. Degradation of the thermal interface material leads to an increase in thermal impedance to the transfer of heat from the pluggable electronic component to the heat dissipation device.

Accordingly, a need exists for a thermal interface material for application to the interface between a pluggable electronic component and a heat dissipation device, which interface material is both sufficiently conformable to reduce a thermal impedance of the interface, and abrasion resistant to withstand repeated installations and de-installations of the pluggable electronic component from the host device in contact with the heat dissipation device. It is desired that such abrasion resistance includes both cohesion of thermal interface material, and adhesion of the thermal interface material to a respective surface, such as a surface of the heat dissipation device.

SUMMARY OF THE INVENTION

Disclosed herein is a system, comprising a frame defining a chamber, a heat sink, and a removable electronic component removably insertable into the chamber for thermal contact with the thermal transfer area of the heat sink. The heat sink comprises a metal substrate with a first surface and a second surface defining a thickness therebetween, the metal substrate having a substrate thermal impedance; a thermally conductive film on thermally conductive film disposed on at least a portion of at least one of the first surface or the second surface defining a thermal transfer area, the thermally conductive film comprising (1) a polymer formed from a silicon-containing resin and (2) an inorganic particulate filler. An initial thermal impedance through initial thermal impedance through the thermal transfer area across the thickness is defined prior to Taber abrasion testing, and an abraded thermal impedance through the thermal transfer area across the thickness of the metal substrate is defined upon completion of Taber abrasion testing, wherein the abraded thermal impedance is more than about 50% greater than the initial thermal impedance.

Another embodiment discloses a system, comprising a host device including a frame defining a chamber, a removable module that generates heat which is transferred to a first surface of the module, the module being removably installable in the host device via the chamber, and a heat sink associated with the frame to dissipate the heat from the first surface. The heat sink includes a second surface on which a thermally conductive film is applied to define a thermal transfer area of the heat sink, and wherein a thermally conductive film is applied to define a thermal transfer area of the heat sink on at least a portion of the first surface or the second surface, and wherein the thermally conductive film makes direct contact with the first surface or the second surface when the module is installed in the device to permit the heat to be received from the first surface. The system exhibits an initial thermal impedance through the thermal transfer area prior to Taber abrasion testing, and an abraded thermal impedance through the thermal transfer area upon completion of Taber abrasion testing, the abraded thermal impedance being no more than about 50% greater than the initial thermal impedance.

In yet another embodiment a system is disclosed, wherein the system comprises a host device including a frame defining a chamber, a removable module that generates heat which is transferred to a first surface of the module, the module being removably installable in the host device via the chamber, a heat sink associated with the frame to dissipate the heat from the first surface. The heat sink includes a heat sink including a second surface, and a thermally conductive film applied to the first surface or the second surface. The thermally conductive film makes direct contact with the first surface when the module is installed in the device to permit the heat to be received from the first surface, the second surface includes a corrosion protection layer, and the thermally conductive film includes a silicon-containing polymer interlocked with the corrosion protection layer.

In yet another embodiment a method for forming a heat sink is provided comprising providing a metal substrate with a first surface, treating the first surface with a conversion agent to form a corrosion protection layer, preparing a precursor having a silicon-containing resin and inorganic particulate filler, coating the precursor onto the corrosion protection layer and curing in situ to polymerize the precursor. A silicon-containing polymer formed from the resin interlocks with the corrosion protection layer.

BRIEF DESCRIPTION OF THE DRAWINGS

Figure 7:
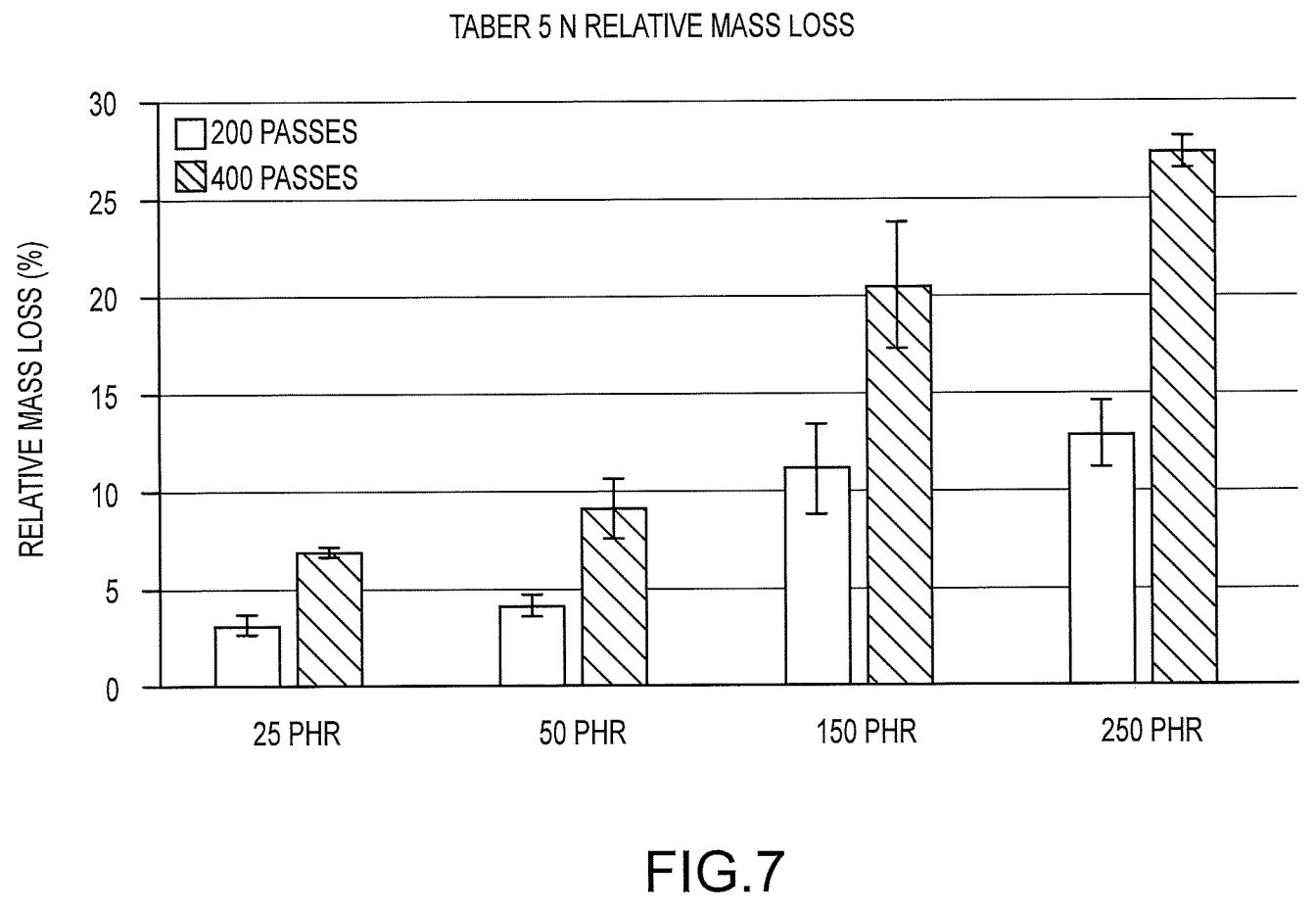

FIG. 7 is a chart illustrating relative mass loss of films from their respective metal substrates after Taber abrasion testing.

DETAILED DESCRIPTION OF THE INVENTION

This invention relates to removable electronic components that are adapted to interact with a host device when installed at the host device. The removable electronic component is installed in, and de-installed from, the host device through a slidable engagement and disengagement with a heat sink. The heat sink is typically positioned in a chamber/receptacle of the host device, such that installation of the removable electronic component places the removable electronic component into thermal contact with the heat sink. The thermal contact is established by a thermal interface between the removable electronic component and the heat sink. The thermal interface is at least partially filled by a thermal interface member of the present invention. The thermal interface member may preferably be an abrasion-resistant and cohesive body in the form of a film or coating. The thermal interface member can be adhered to a heat transfer surface that may be part of or thermally coupled to the heat sink. Installation of the removable electronic component into the chamber/receptacle of the host device places a heat transmitting surface of the removable electronic component into thermal contact with the thermal interface body, which is itself connected to the heat sink.

As used herein, the term "host device" is intended to mean a computer or computing device, network device, signal transmitter, signal receiver, switch, data storage device, subsystem, printed circuit board, integrated circuit, microprocessor, or the like.

Figure 1:
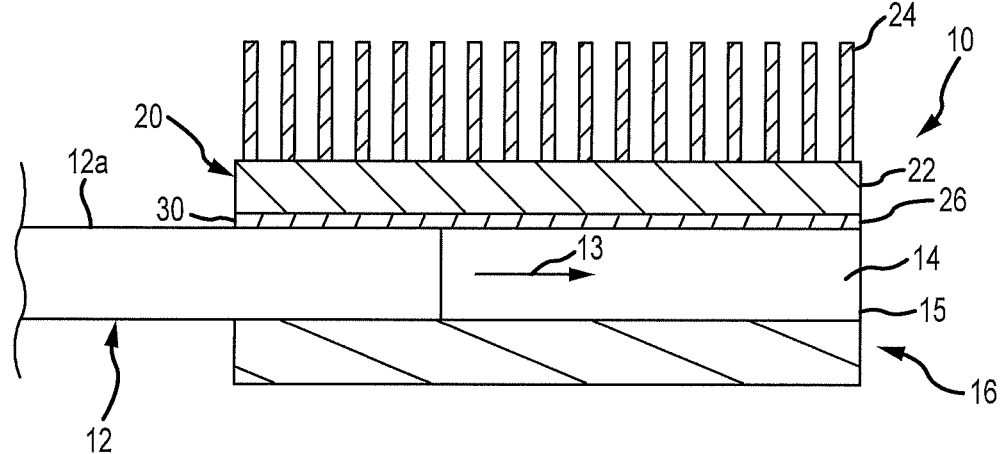
FIG. 1 depicts a schematic cross-sectional view of a system of the present invention, with a removable module being installed into a host device.
Figure 2:
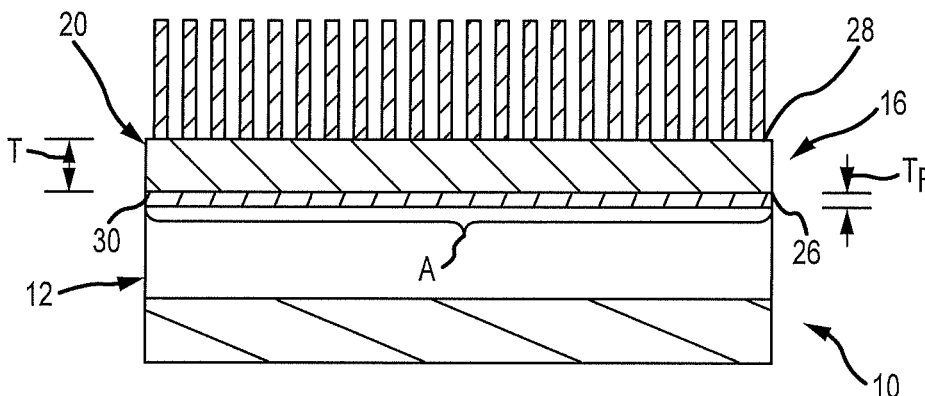
FIG. 2 depicts a schematic cross-sectional view of a system of the present invention, with the removable module installed into the host device.

FIGS. 1 and 2 depict schematic cross-sectional views of an example system 10 of the present invention. A removable module 12 illustrated as being installed along direction arrow 13 into a chamber 14 of host device 16 is shown in FIG. 1. FIG. 2 illustrates system 10 with removable module 12 installed at host device 16. Removable module 12 may have a first surface 12a to which heat generated by removable module 12 is transferred. It is contemplated that heat generated by removable module 12 may be transferred to portions of removable module 12 in addition to first surface 12a, but for the purposes of this description, heat dissipation is directed through first surface 12a to host device 16. Removable module 12 may be, for example, a pluggable optical transceiver.

The system 10 includes a heat sink 20 for dissipating heat from removable module 12 through first surface 12a. Heat sink 20 may be associated with a frame 15 of host device 16. Heat sink 20 is typically constructed of highly thermally conductive materials, such as metals, metal alloys, and the like, and may include one or more heat dissipation devices that are effective to dissipate heat generated by removable module 12. In the embodiment illustrated in FIG. 1, heat sink 20 may include a plate portion 22 and heat dissipation fins 24 extending from and thermally coupled to plate portion 22. Heat dissipation fins 24 provide increased surface area to enhance the transfer of heat to a cooling medium (not shown) in contact with heat dissipation fins 24, such as ambient air. The heat sink 20 can be made of a variety of thermally conductive materials, examples of which include but are not limited to aluminum and copper. The plate portion 22 of heat sink 20 includes a heat reception surface 26 for receiving heat from removable module 12.

A thermally conductive film 30 is preferably applied to heat reception surface 26 to define a thermal transfer area "A" wherein heat from removable module 12 is most efficiently transferred to heat sink 20 through thermally conductive film 30. Such thermal transfer area "A" reduces the thermal impedance to heat sink 20. Thermal transfer area "A" can be any size, preferably about 0.5-1.5 cm², more preferably about 1.0 cm².

A thickness "T" is defined between the heat reception surface 26 and the heat dissipation surface 28. As shown in FIG. 1, the heat sink 20 and thermally conductive film 30 may be mounted to frame 15 in a manner that causes contact with first surface 12a of module 12, when the removable module 12 is installed as illustrated in FIG. 2. This contact permits the heat sink 20 to receive heat that is generated by removable module 12, and to dissipate the heat in a suitable manner.

When module 12 is installed in chamber 14 of host device 16, the thermally conductive film 30 is thermally coupled to first surface 12a of module 12, preferably in direct contact therewith. Thermally conductive film 30 is therefore positioned at a thermal interface between module 12 and heat sink 20. In this manner, module 12 is thermally coupled to heat sink 20 via thermally conductive film 30.

Thermally conductive film 30 is conformable, deformable, and/or flexible to fill gaps between first surface 12a of removable module 12 and heat reception surface 26. The thermally conductive film 30 therefore acts to fill the void spaces that otherwise would present significant impedance to thermal transfer between first surface 12a of removable module 12 and heat reception surface 26 of heat sink 20. As a result, thermally conductive film 30 forms a portion of the heat transfer path between removable module 12 and heat dissipation surface 28/heat dissipation fins 24. The heat transfer path is established transferring heat through conduction from first surface 12a, through thermally conductive film 30, and to heat reception surface 26.

In order to effectively fill the void spaces at the interface between the removable module 12 and heat sink 20, thermally conductive film 30 preferably exhibits a relatively low modulus of elasticity/Young's modulus, as well as a relatively low flexural modulus. In some embodiments, thermally conductive film 30 has a modulus of elasticity/Young's modulus of less than about 10 MPa, and more preferably less than about 1 MPa with a rebound of greater than about 95% after compression per ASWTM-D395. The flexibility/deformability of thermally conductive film 30 may be adjusted with changes to its shape or thickness. In some particularly useful embodiments, thermally conductive film 30 is applied with a generally uniform thickness ("Tr") of less than about 75 μm, for example about 10-50 μm.

Thermally conductive film 30 is thermally conductive, conformable, and abrasion resistant, so that thermally conductive film 30 is durable in an application like that described above with removable module 12 being repeatedly installed and de-installed from chamber 14 of host device 16. The removable module 12 is typically installed and reinstalled with sliding physical contact with thermally conductive film 30. Accordingly, destruction of thermally conductive film 30 as a result of such repeated installations and de-installations can significantly increase the thermal impedance at the interface between first surface 12a of module 12 and heat reception surface 26 of heat sink 20. Therefore, it is important that the thermally conductive film 30 also be resistant to abrasion as a result of sliding contact between module 12 and thermally conductive film 30. In some embodiments, thermally conductive film 30 may exhibit a thermal conductivity of at least about 0.1 W/m·K, and more preferably at least about 0.5 W/m·K, with the thermal conductivity measured through thickness $T_f$ of the thermally conductive film 30.

Thermally conductive film 30 is preferably formed from one or more polymer-forming resins and one or more inorganic particulate fillers. In some embodiments, the polymer-forming resin is a silicon-containing thermosetting resin. Exemplary thermosetting resin compositions contemplated for use in thermally conductive film 30 include epoxies, acrylates, and polyurethanes. Further examples of polymer-forming resins useful in thermally-connective film 30 of the present invention are described at U.S. Pat. Nos. 5,028,984 and 3,908,040, incorporated herein by reference in their entirety.

In an exemplary embodiment, a cross-linked polymer network is formed from a two-part platinum-catalyzed, addition-cure silicone polymer, which uses a vinyl-terminated polydimethylsiloxane reacted with a methylhydrosiloxane-dimethylsiloxane, trimethylsiloxy terminated copolymer.

An inorganic particulate filler is also included in thermally-conductive film 30. In some embodiments, the inorganic particulate filler is selected from the group of aluminum oxide, diamond, clay, aluminosilicate, aluminum nitride, boron nitride, aluminum oxide, aluminum nitride, magnesium oxide, zinc oxide, silicon carbide, silicon dioxide, beryllium oxide, antimony oxide, and combinations thereof. In a particularly useful embodiment, the inorganic particulate filler is aluminum nitride. In another embodiment, the filler is selected from the group consisting of carbon nanotubes, graphene, fullerene, and graphite.

The inorganic particulate filler can be added to the polymer-forming resin at a concentration of less than about 300 parts per one hundred parts resin (phr), and more preferably less than about 150 phr. It has surprisingly been determined that an inorganic particulate filler concentration of less than or equal to 50 phr provides benefit of enhancing the abrasion resistance of thermally conductive film 30. As described in greater detail below, a reduction in inorganic particulate filler loading to thermally conductive film 30 reduces the degradation of the thermally conductive film after abrasion testing, and therefore minimizes the increase in thermal impedance at thermal transfer area "A" subsequent to abrasion testing. It is believed that the lower particulate filler concentration reduces interference in polymer matrix adhesion to the metal substrate. As a result, the lower particulate filler concentration may permit a "tougher" cross-linked polymer that exhibits enhanced abrasion resistance. Such enhanced abrasion resistance maintains a lower thermal impedance after abrasion testing, even though less inorganic filler is present in thermally conductive film 30. Abrasion resistance and maintenance of polymer matrix continuity surprisingly performs better in maintaining a low thermal impedance than a film that, on its own, may be more thermally conductive due to a higher inorganic particulate filler concentration level.

In some embodiments, the inorganic particulate filler may have a maximum particle size of less than about 50 μm, and more preferably less than about 25 μm. The inorganic particulate filler may, in exemplary embodiments, have an average particle size of between about 1-5 μm, and more preferably about 3 μm.

A heat sink including thermally conductive film 30 may be formed by applying a precursor to heat reception surface 26 of plate portion 22, and curing the precursor in situ at heat reception surface 26. In a useful embodiment, plate portion 22 comprises a metal substrate with a first surface, such as heat reception surface 26, of an aluminum or copper plate portion 22. Other metals or metal alloys including metal coatings at heat reception surface 26 are contemplated by the present invention. In some embodiments, the first surface of the metal substrate may be treated with a conversion agent to form a corrosion protection layer. The conversion agent can be at least one of a hexavalent chromium, a trivalent chromium, tin, titanium oxide, magnesium oxide, non-chromium containing Alodine, and zinc.

A precursor for application to the conversion treated first surface of the metal substrate may include a silicon-containing resin and an inorganic particulate filler, wherein the silicon-containing resin may be a polymer-forming resin. Such a precursor may be coated onto the corrosion protection layer at a thickness of less than 75 μm, and preferably between 10-50 μm. A precursor may be coated onto the corrosion protection layer through screen printing, slot coating, dip coating, selective printing, curtain coating, slot die dispensing, or other suitable coating techniques. The precursor material may be liquidous, paste-like, gel-like, grease-like, or other forms known as a pre-cured condition. In one embodiment, the precursor may be a solution in one or more solvents. The coated precursor may be cured by an appropriate curing mechanism in situ to polymerize the precursor, wherein the silicon-containing polymer formed from the resin interlocks with the corrosion protection layer. The curing mechanisms contemplated for use herein include but are not limited to ultraviolet irradiation, thermal radiation, sonication, chemical curing, and the like.

The term "interlocks" is intended herein to mean a bond between the silicon-containing polymer and the corrosion protection layer that involves at least in part a mechanical interlocking as described in "Chemical Adhesion of Silicone Elastomers on Primed Metal Surfaces: A Comprehensive Survey of Open and Patent Literatures", *Progress in Organic Coatings*, Loic Picard et al., Volume 80 (2015) pages 120-141, the content of which being herein incorporated by reference. An example of such bond couples a silicone elastomer to a primed metal surface.

Figure 3:
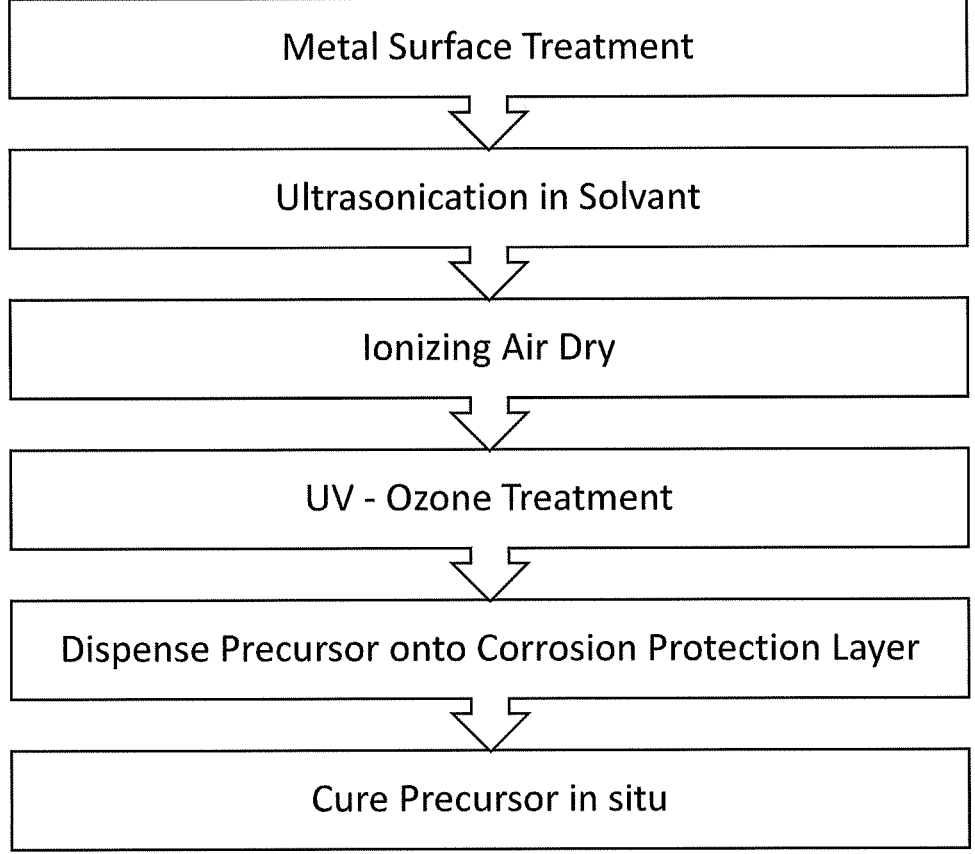
FIG. 3 depicts a flow diagram of steps for coating a metal substrate with a thermally conductive film.
Figure 4:
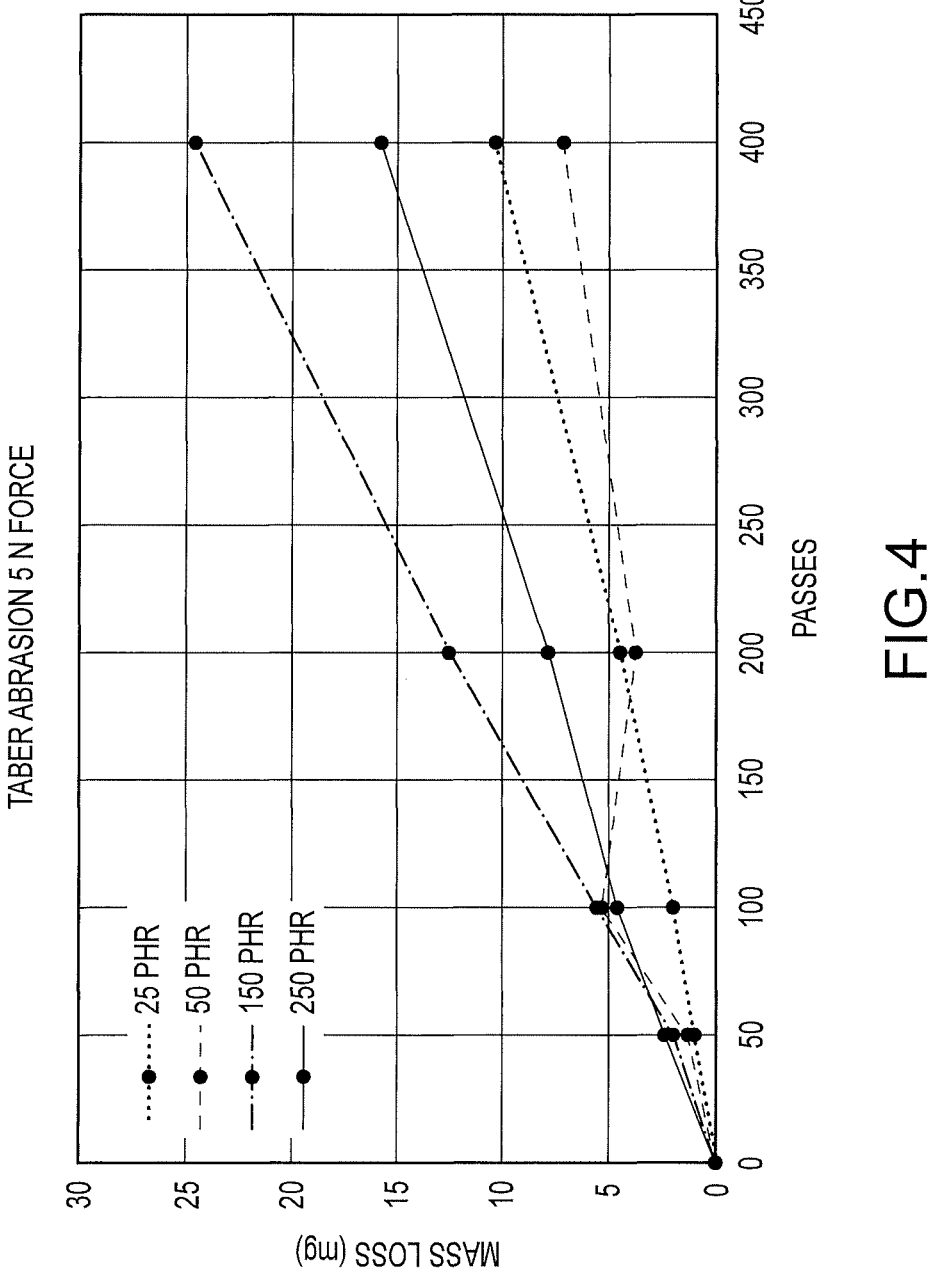
FIG. 4 is a chart illustrating absolute mass loss of films from their respective metal substrates after Taber abrasion testing.
Figure 5:
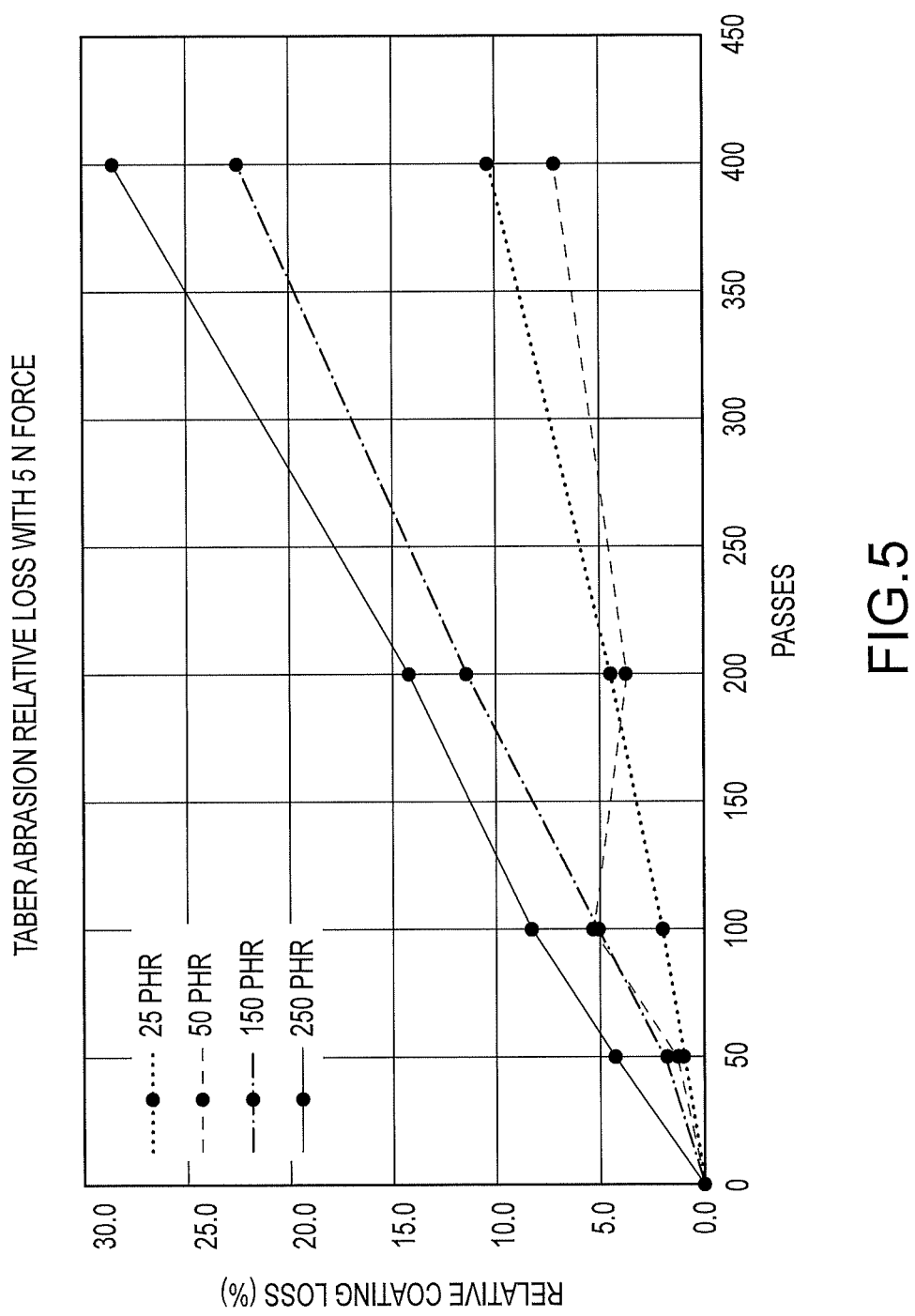
FIG. 5 is a chart illustrating relative mass loss of films from their respective metal substrates after Taber abrasion testing.
Figure 6:
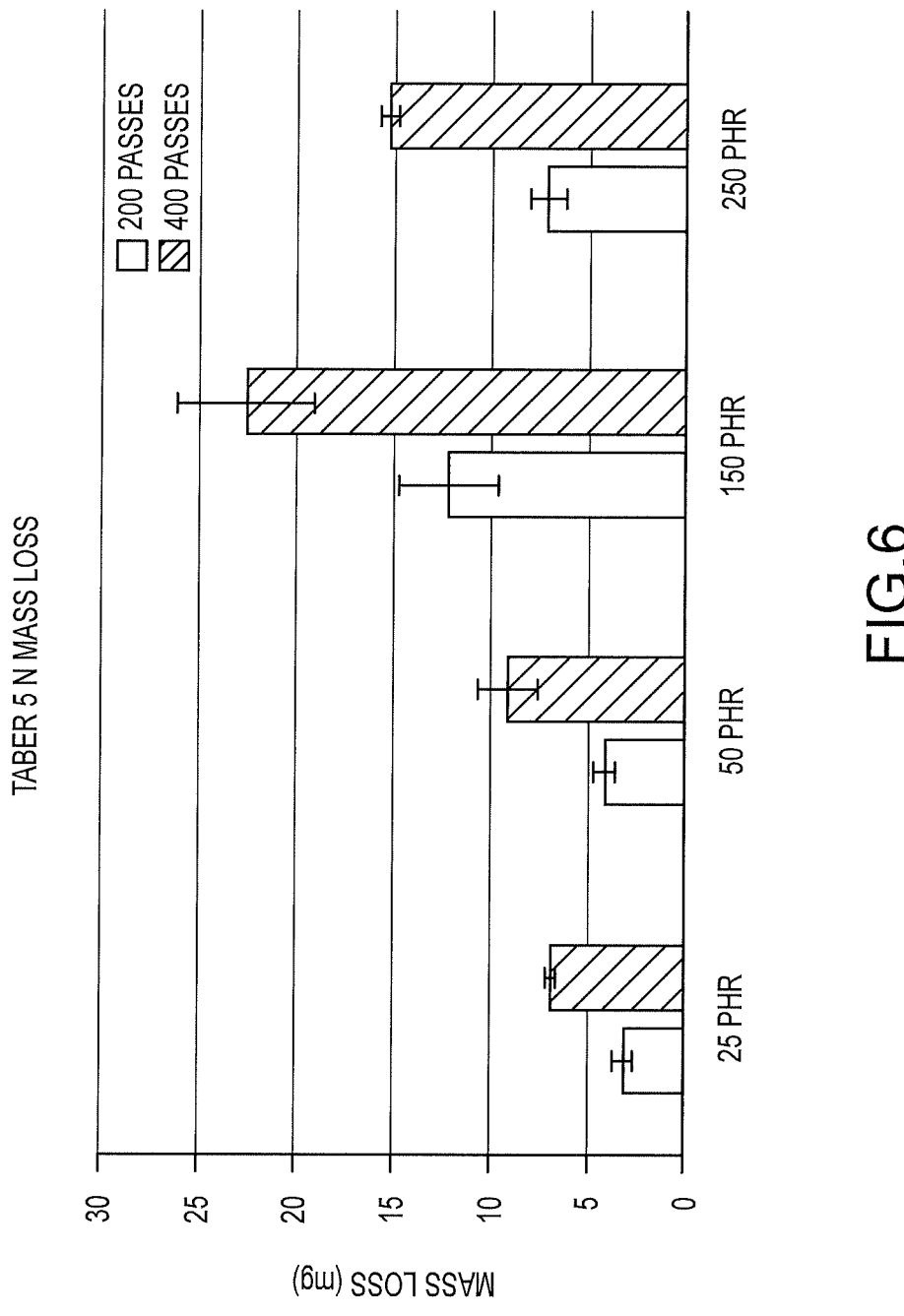
FIG. 6 is a chart illustrating absolute mass loss of films from their respective metal substrates after Taber abrasion testing.

An exemplary process for forming heat sink 20 incorporating thermally conductive film 30 is now described with reference to the flow diagram of FIG. 3. To provide the desired abrasion resistance, the thermally conductive film exhibits a high level of cohesion, as well as a high level of adhesion to the metal heat reception surface 26. To assist in such adhesion, heat reception surface 26 may be treated for enhanced bonding with the polymer film. A metal surface may be passivated to form a corrosion protection layer that also acts to interlock with the polymer of the thermally conductive film. Various metal surface treatments may be employed to passivate the metal surface, including but not limited to anodization, chromate conversion, tin plating, and zinc plating. An example of a useful metal surface treatment is a chromate conversion coating using a trivalent (Type 1) or hexavalent (Type 2) chromium commercially available under the trademarks Bonderite or Alodine from Henkel Corporation, Madison Heights, MI.

Other useful metal surface treatments include an electro-ceramic coating available under the trade name EC², from Henkel Corporation and as described in U.S. patent application publication no. 2017/0121841, as well as the metal surface treatments described in U.S. Pat. Nos. 6,946,401; 6,361,833; 4,162,947; and 3,434,943, and U.S. patent application publication no. 2010/0038254, the contents of each of which are incorporated herein in their entireties.

The treated metal heat sink is then submerged in a solvent such as isopropyl alcohol, acetone, alkane, or water for ultrasonication for 2-10 minutes. The metal heat sink is removed from the ultrasonication bath and dried using an ionizing air gun, such as the "Top Gun Static Elimination Gun" available from Simco-Ion, to reduce or eliminate static charges and particulates from the metal surface.

Following the ionizing air drying step, the metal heat sink is treated with ultra-violet radiation and ozonation to clean solvent residues, silicone oil, or flux.

A precursor having a silicon-containing resin and inorganic particulate filler is prepared and dispensed onto the corrosion protection layer prepared as described above. The precursor may be dispensed on the corrosion protection layer of the passivated metal surface by screen printing, or other low-volume dispensing procedure such as slot coating, dip coating, or selective printing. The coated heat sink is then baked in an oven at 25-200° C. for 1-240 minutes to cure/polymerize the precursor in situ.

The thermally conductive film compositions according to the present invention may optionally further include one or more flow additives, adhesion promoters, rheology modifiers, toughening agents, fluxing agents, reaction rate controllers, and the like, as well as combinations thereof. An example of a reaction rate moderator is tetravinyltetramethylcyclotetrasiloxane. An example or a surface coupling agent/adhesion promoter to improve adhesion of the film to the metal heat sink includes epoxy functional trimethoxysilanes, vinyl functional trimethoxysilanes, and methacrylate functional trimethoxysilanes. Titanium (iv) butoxide may be used to catalyze the condensation of the silane coupling agents to the target substrate. An example of a toughing agent may include hexamethyldisilazane treated fumed silica.

Film Compositions

The following compositions are intended to be exemplary only, and represent certain components that may be included in the film compositions of the present invention.

| Example Material 1 (For Aluminum Metal Substrates) | | | |
|---|---|---|---|
| Material | Source | Weight % | Purpose |
| Vinyl-terminal PDMS | Gelest DMS-V46 | 40-65 | Bulk Resin |
| 3 micron Aluminum Nitride | | 25-40 | Thermally Conductive Filler |
| Fumed Silica | Evonik R812 | 8-12 | Toughening Agent |
| Hydride-Dimethyl Silicone Copolymer | Gelest HMS-501 | 0.5-1.0 | Polymer Crosslinker |
| Titanium (IV) tert-butoxide | Sigma-Aldrich | 0.1-0.5 | Surface Coupling Agent Catalyst |
| 3-glycidoxypropyl-trimethoxysilane | Momentive A-187 | 0.1-0.5 | Surface Coupling Agent |
| 7-Octenyltrimethoxysilane | Gelest | 0.1-0.5 | Surface Coupling Agent |
| Platinum Catalyst | Evonik 512 | 0.1-0.3 | Polymerization Catalyst |
| Tetravinyltetramethyl-cyclotetrasiloxane | Andisil MVC | 0.05-0.2 | Reaction Rate Moderator |

| Example Material 2 (For Copper Metal Substrates) | | | |
|---|---|---|---|
| Material | Source | Weight % | Purpose |
| Vinyl-terminal PDMS | Gelest DMS-V46 | 40-65 | Bulk Resin |
| 3 micron Aluminum Nitride | | 25-40 | Thermally Conductive Filler |
| Fumed Silica | Evonik R812 | 8-12 | Toughening Agent |
| Hydride-Dimethyl Silicone Copolymer | Gelest HMS-501 | 0.5-1.0 | Polymer Crosslinker |
| Titanium (IV) tert-butoxide | Sigma-Aldrich | 0.1-0.5 | Surface Coupling Agent Catalyst |
| 3-glycidoxypropyl-trimethoxysilane | Momentive A187 | 0.1-0.5 | Surface Coupling Agent |
| 3-(trimethoxysilyl)propyl methacrylate | Momentive A184 | 0.1-0.5 | Surface Coupling Agent |
| Platinum Catalyst | Evonik 512 | 0.1-0.3 | Polymerization Catalyst |
| Tetravinyltetramethyl-cyclotetrasiloxane | Andisil MVC | 0.05-0.2 | Reaction Rate Moderator |

Abrasion Resistance Testing

Heat sinks coated with the thermally conductive films of the present invention were tested for abrasion resistance and thermal performance. The test method used herein, named "Taber Abrasion Testing" includes concepts from the ASTM standards of G133, F732, F2025, F2496, and D4060 in order to assess the resistance of a coating to wear. Because the success of the films of the present invention is dependent upon its resistance to abrasion over the course of repeated installations and de-installations with the host device, the Taber Abrasion Test seeks to quantitatively assess the performance of the film. Similar to that which is outlined in ASTM F732 and F2496, the quantitative measure of abrasion resistance is the volume percent lost of the coated film over the course of abrasion testing. Volume loss may be determined gravimetrically by calculating the mass loss after abrading, similar to ASTM G133 and D4060. Original mass and lost mass of the coated film permits a comparison of coatings having different densities.

A reciprocating abraser is available from Taber Industries under Model 5900. The Taber reciprocating abraser was fitted with a Scotch-Brite® general purpose cleaning pad from 3M Company as the abrading surface. An analytical balance capable of measuring to the nearest 0.1 mg was used to determine the mass of the loaded film, as well as the mass loss subsequent to the abrasion test.

Procedure

The film mass was determined by finding the difference between the mass of the coated substrate and the tare weight of the coated metal substrate. The sample to be abraded was placed into a fixture on the reciprocating abraser and is held firmly in place. The abrading pad, having an area of 1 in², was then placed in contact with the film, and a force of 5N was applied. The reciprocating abraser was engaged, and linearly reciprocated for a desired number of cycles at a rate of 60 cycles per minute. Reciprocating "cycle" used herein comprises two passes across the film surface, wherein each pass covers an 80 mm stroke length. Each sample included the film of either example material 1 or example material 2 applied to a 1 in×4 in aluminum lap under the procedure described with reference to FIG. 3.

After completion of the reciprocating cycles, the sample was removed from the fixture, and any loose material/debris was removed with compressed air at 35 psi, and wiped clean with a lint-free wipe soaked in isopropyl alcohol. The abraded sample was then allowed to dry, and was weighed to determine the mass loss of the film. Any film mass lost over 20% when exposed to 400 cycles of the reciprocating abraser is considered failure of the film durability. The samples were weighed after each of 50, 100, 200, and 400 passes.

Results

An experiment was conducted using the Taber abrasion testing technique on the aluminum substrate samples coated with the Example Material 1, but with varying particulate filler concentrations. FIGS. 5-8 illustrate results of Taber abrasion testing on samples incorporating 25, 50, 150, or 250 phr aluminum nitride filler. FIGS. 5-8 illustrate the surprising benefit to abrasion resistance of a film containing less than or equal to 50 phr inorganic filler. The results are particularly illustrative in the "relative mass loss" charts, which account for the relative mass loss upon Taber abrasion testing, rather than solely absolute mass loss, which can be effected by initial mass of the film coating.

Thermal Performance Testing

Abrasion resistance and durability was also tested through a thermal performance, comparing thermal impedance before and after Taber abrasion testing. Thermal impedance was tested pursuant to test method MET BASA #MET-5.4-01-1900-Test 2.1 on an area of about 1.0 cm². The thermal impedance increase by 50% after Taber abrasion testing is considered a failure.

EXAMPLES

The following samples were tested for both abrasion resistance and thermal performance following Taber abrasion testing:

| Sample ID | Metal Substrate Material | Corrosion Protection Layer | Film Material | Film Thickness | Inorganic particulate material | Filler Loading | Taber durability | Thermal performance |
|---|---|---|---|---|---|---|---|---|
| | Aluminum | None | Example Material 1 | 25 μm | Aluminum nitride | 50 phr | Pass | Pass |
| | Copper | None | Example Material 1 | 25 μm | Aluminum nitride | 50 phr | Fail | Fail |
| Comparitive A | Aluminum | Type 2 Alodine film/hexavalent chromate film | Sil-Pad ™ from Henkel | 25 μm | Alumina | 200 phr | Fail | Fail |
| Comparitive B | Aluminum | Type 2 Alodine film/hexavalent chromate film | HF300 ™ from Henkel | 25 μm | Alumina | 500 phr | Fail | Fail |
| Comparitive C | Aluminum | Type 2 Alodine film/hexavalent chromate film | LF3500 | 25 μm | Alumina | 1200 phr | Fail | Fail |
| Comparitive D | Aluminum | Type 2 Alodine film/hexavalent chromate film | Graphite Sheets | 25 μm | Alumina | N/A | Fail | Fail |
| Example 1 | Aluminum | Type 2 Alodine film/hexavalent chromate film | Example Material 1 | 25 μm | Alumina | 50 phr | Pass | Pass |
| Example 2 | Aluminum | Type 1 Alodine/trivalent chromate film | Example Material 1 | 25 μm | Aluminum nitride | 50 phr | Pass | Pass |
| Example 3 | Aluminum | Type 2 anodization without PTFE sealant | Example Material 1 | 25 μm | Aluminum nitride | 50 phr | Pass | Pass |
| Example 4 | Aluminum | Type 3 anodization without PTFE sealant | Example Material 1 | 25 μm | Aluminum nitride | 50 phr | Pass | Pass |
| Example 5 | Aluminum | Type 2 anodization with PTFE sealant | Example Material 1 | 25 μm | Aluminum nitride | 50 phr | Fail | Fail |
| Example 6 | Aluminum | EC² film | Example Material 1 | 25 μm | Aluminum nitride | 50 phr | Pass | Pass |
| Example 7 | Aluminum | Type 2 Alodine/hexavalent chromate film | Example Material 1 | 25 μm | Aluminum nitride | 100 phr | Pass | Pass |
| Example 8 | Aluminum | Type 2 Alodine/hexavalent chromate film | Example Material 1 | 25 μm | Alumina | 100 phr | Pass | Pass |
| Example 9 | Aluminum | Type 2 Alodine/ | Example | 25 μm | Graphite | 100 phr | Pass | Pass |

-continued

| Sample ID | Metal Substrate Material | Corrosion Protection Layer | Film Material | Film Thickness | Inorganic particulate material | Filler Loading | Taber durability | Thermal performance |
|---|---|---|---|---|---|---|---|---|
| | | hexavalent chromate film | Material 1 | | | | | |
| Example 10 | Aluminum | Type 2 Alodine/ hexavalent chromate film | Example Material 1 | 25 μm | Alumina and boron nitride | Alumina –75 phr; boron nitride –25 phr | Pass | Pass |
| Example 11 | Aluminum | Type 2 Alodine/ hexavalent chromate film | Example Material 1 | 25 μm | Aluminum nitride and boron nitride | Aluminum nitride –75 phr; boron nitride –25 phr | Pass | Pass |
| Example 12 | Aluminum | Pre-silane treatment | Example Material 1 | 25 μm | Aluminum nitride | 50 phr | Pass | Pass |
| Example 13 | Aluminum | Type 2 Alodine/ hexavalent chromate film | Example Material 1 | 25 μm | Aluminum nitride | 50 phr | Pass | Pass |
| Example 14 | Copper | Tin plating | Example Material 2 | 25 μm | Aluminum nitride | 50 phr | Pass | Pass |
| Example 15 | Copper | Zinc plating | Example Material 2 | 25 μm | Aluminum nitride | 50 phr | Pass | Pass |
| Example 16 | Copper | Plasma treatment | Example Material 2 | 25 μm | Aluminum nitride | 50 phr | Pass | Pass |
| Example 17 | Copper | Plasma treatment of tin plating | Example Material 2 | 25 μm | Aluminum nitride | 50 phr | Pass | Pass |
| Example 18 | Copper | Plasma treatment of zinc plating | Example Material 2 | 25 μm | Aluminum nitride | 50 phr | Pass | Pass |

What is claimed is:

1. A system, comprising:

a host device including a frame defining a chamber;

a removable module that generates heat which is transferable to a first surface of the module, the module being removably installable in the chamber;

a heat sink associated with the frame to dissipate the heat from the first surface, wherein the heat sink includes a second surface having a corrosion protection layer including at least one of a trivalent chromium and a hexavalent chromium; and a thermally conductive film including a silicone elastomer and thermally conductive inorganic particulate filler dispersed in the silicone elastomer at a concentration of between 25 and 50 phr, wherein the thermally conductive film is applied to the second surface such that the silicone elastomer is interlocked with the corrosion protection layer, and wherein the thermally conductive film makes direct contact with the first surface when the module is installed in the device to permit the heat to be received from the first surface.

2. The system of claim 1 wherein the inorganic particulate filler has an average particle size of about 3 μm and comprises at least one of graphene, fullerene, and graphite.

3. The system of claim 1 wherein the inorganic particulate filler is selected from the group of aluminum oxide, zinc oxide, magnesium oxide, aluminum nitride, boron nitride, silicon dioxide, diamond, clay, aluminosilicate, and combinations thereof.

4. The system of claim 1 wherein the thickness of the substrate is between about 10-100 μm.

5. The system of claim 1 wherein the thermally conductive film is less than about 25 μm thick.

6. The system of claim 1 wherein the thermally conductive film reduces thermal impedance of a region of contact between the heat sink and the first surface.

7. A method for forming the heat sink of the system according to claim 1, comprising:

providing a metal substrate with a first surface;

treating the first surface with a conversion agent to form the corrosion protection layer;

preparing a precursor having a silicon-containing resin and inorganic particulate filler;

coating the precursor onto the corrosion protection layer and curing in situ to polymerize the precursor, wherein a silicon-containing polymer formed from the resin interlocks with the corrosion protection layer.

8. The method of claim 7 wherein the conversion agent includes at least one of a hexavalent chromium, and a trivalent chromium.

9. The method of claim 7, including coating the precursor onto the corrosion protection layer by screen printing, slot coating, dip coating, selective printing, or a combination thereof.

10. The method of claim 8 wherein the silicon-containing polymer is less than about 25 μm thick.

11. The method of claim 7 wherein the inorganic particulate filler is present at a concentration of less than or equal to 50 phr.

* * * * *